(12) United States Patent
Ozasa

(10) Patent No.: US 10,868,516 B2
(45) Date of Patent: Dec. 15, 2020

(54) SURFACE ACOUSTIC WAVE FILTER

(71) Applicant: Murata Manufacturing Co., Ltd., Nagaokakyo (JP)

(72) Inventor: Motoki Ozasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 376 days.

(21) Appl. No.: 15/807,904

(22) Filed: Nov. 9, 2017

(65) Prior Publication Data

US 2018/0138891 A1 May 17, 2018

(30) Foreign Application Priority Data

Nov. 17, 2016 (JP) ................................. 2016-224143

(51) Int. Cl.
*H03H 9/64* (2006.01)
*H03H 9/25* (2006.01)
*H03H 9/145* (2006.01)
*H03H 9/02* (2006.01)

(52) U.S. Cl.
CPC ...... *H03H 9/6489* (2013.01); *H03H 9/02992* (2013.01); *H03H 9/14544* (2013.01); *H03H 9/25* (2013.01); *H03H 9/6436* (2013.01); *H03H 9/6483* (2013.01)

(58) Field of Classification Search
CPC .. H03H 9/02992; H03H 9/14544; H03H 9/25; H03H 9/6436; H03H 9/6483; H03H 9/6489
USPC ......................................... 333/193, 195, 133
See application file for complete search history.

(56) References Cited

U.S. PATENT DOCUMENTS

| | | | | |
|---|---|---|---|---|
| 7,245,193 B2* | 7/2007 | Funasaka | ........... | H03H 9/02574 333/193 |
| 8,319,585 B2* | 11/2012 | Miyake | ................ | H03H 9/6436 333/193 |
| 8,988,162 B2* | 3/2015 | Tsutsumi | ............. | H03H 9/0566 333/133 |
| 2010/0127799 A1* | 5/2010 | Bauer | .................. | H03H 9/0542 333/195 |
| 2012/0313724 A1 | 12/2012 | Tsurunari et al. | | |

(Continued)

FOREIGN PATENT DOCUMENTS

| JP | 2010-062873 A | * | 3/2010 |
|---|---|---|---|
| WO | 2011/061904 A1 | | 5/2011 |
| WO | 2016/013330 A1 | | 1/2016 |

OTHER PUBLICATIONS

English language machine translation of JP 2010-062873 A, published Mar. 18, 2010, 16 pages. (Year: 2010).*

*Primary Examiner* — Barbara Summons
(74) *Attorney, Agent, or Firm* — Keating & Bennett, LLP

(57) ABSTRACT

A surface acoustic wave filter includes a longitudinally coupled filter connected between an input terminal and an output terminal on a main surface of a piezoelectric substrate and that includes longitudinally coupled resonators and a parallel arm resonator connected between a node between the input terminal and the longitudinally coupled filter and ground. A line connecting IDT electrodes at an input side of a portion of the longitudinally coupled resonators to the ground and a line connecting the parallel arm resonator to the ground are independently provided and are connected to the same ground terminal.

20 Claims, 9 Drawing Sheets

(56) References Cited

U.S. PATENT DOCUMENTS

| | | | |
|---|---|---|---|
| 2014/0111286 A1* | 4/2014 | Taniguchi | H03H 9/0566 |
| | | | 333/133 |
| 2014/0176257 A1* | 6/2014 | Takamine | H03H 9/6433 |
| | | | 333/133 |
| 2016/0094200 A1* | 3/2016 | Kim | H03H 9/02992 |
| | | | 333/195 |
| 2017/0099044 A1 | 4/2017 | Takamine | |

* cited by examiner

SURFACE ACOUSTIC WAVE FILTER

CROSS REFERENCE TO RELATED APPLICATIONS

This application claims the benefit of priority to Japanese Patent Application No. 2016-224143 filed on Nov. 17, 2016. The entire contents of this application are hereby incorporated herein by reference.

BACKGROUND OF THE INVENTION

1. Field of the Invention

The present invention relates to a surface acoustic wave filter.

2. Description of the Related Art

Elastic wave filter apparatuses which include ladder filters connected to longitudinally coupled resonator filters (for example, refer to International Publication No. 2011/061904) are known.

A surface acoustic wave filter described in International Publication No. 2011/061904 includes a ladder filter unit in which series arm resonators and parallel arm resonators are alternately provided and a longitudinally coupled filter unit between an input terminal and an output terminal. In the surface acoustic wave filter described in International Publication No. 2011/061904, a ground line is shared between the longitudinally coupled filter unit and the parallel arm resonators in the ladder filter unit to decrease the area of the wiring on a substrate, thereby realizing a reduction in size.

Since the ground line is shared between the longitudinally coupled filter unit and the parallel arm resonators in the ladder filter unit in the surface acoustic wave filter in the related art, the ground line in the shared portion is likely to be affected by parasitic inductance. Accordingly, there is a problem in that attenuation characteristics of the surface acoustic wave filter are degraded.

SUMMARY OF THE INVENTION

Preferred embodiments of the present invention provide surface acoustic wave filters capable of achieving excellent attenuation characteristics of the filter.

According to a preferred embodiment of the present invention, a surface acoustic wave filter includes a longitudinally coupled filter that is connected between an input terminal and an output terminal on a main surface of a piezoelectric substrate and that includes at least one longitudinally coupled resonator and a parallel arm resonator connected between a node between the input terminal and the longitudinally coupled filter and ground. At least one of a first line used to connect an interdigital transducer electrode at an input side of the longitudinally coupled resonator to the ground and a second line used to connect an interdigital transducer electrode at an output side of the longitudinally coupled resonator to the ground and a third line used to connect the parallel arm resonator to the ground are independently provided and are connected to the same terminal.

With the above surface acoustic wave filter, since the ground line of the parallel arm resonator in a ladder filter and the ground line of the longitudinally coupled filter are not shared, a parasitic inductance component resulting from the sharing of the ground lines is able to be reduced. As a result, the attenuation of the surface acoustic wave filter is able to be made sharp and the amount of attenuation is able to be increased at the low frequency side of the band of the filter. In addition, the sharing of the ground terminal of the parallel arm resonator in the ladder filter and the ground terminal of the longitudinally coupled filter enables the number of the ground terminals to be decreased. Accordingly, it is possible to reduce the surface acoustic wave filter in size while keeping excellent transmission characteristics of the surface acoustic wave filter.

In a preferred embodiment of the present invention, the surface acoustic wave filter, the first line and the third line may be independently provided, the second line and the third line may be independently provided, and the first line, the second line, and the third line may be connected to the same terminal.

With the above configuration, since the ground potential is stabilized in the longitudinally coupled filter, the transmission characteristics of the surface acoustic wave filter are able to be made sharp and the amount of attenuation is able to be increased at the low frequency side of the band of the filter. In other words, the transmission characteristics of the surface acoustic wave filter are further improved. In addition, the sharing of the ground terminal of the parallel arm resonator in the ladder filter and the ground terminal of the longitudinally coupled filter enables the number of the ground terminals to be decreased, thus reducing the surface acoustic wave filter in size.

A surface acoustic wave filter of a preferred embodiment of the present invention may further include a series arm resonator connected in series between the input terminal and the longitudinally coupled filter. The parallel arm resonator may be connected between a node between the series arm resonator and the longitudinally coupled filter and the ground.

With the above configuration, it is possible to further improve the bandpass characteristics of the surface acoustic wave filter by, for example, adjusting the impedance of a pass band to ensure the attenuation at the high frequency side outside the band.

According to preferred embodiments of the present invention, it is possible to provide surface acoustic wave filters capable of realizing a reduction in size while achieving excellent attenuation characteristics of the filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
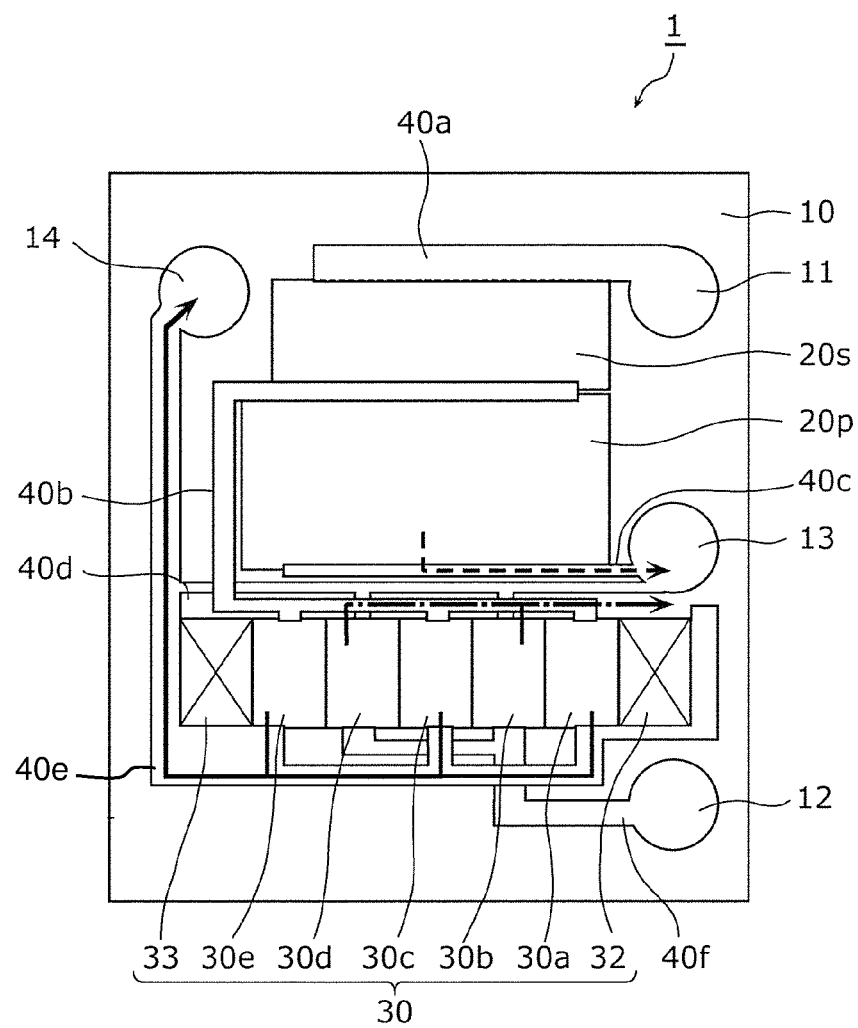
FIG. 1 is a plan view illustrating an exemplary configuration of a surface acoustic wave filter according to a first preferred embodiment of the present invention.

Preferred embodiments of the present invention will herein be described with reference to the drawings. The preferred embodiments described below indicate preferred specific examples of the present invention. Accordingly, numerical values, shapes, materials, components, the positions where the components are arranged, the connection mode of the components, and so on, which are indicated in the preferred embodiments described below, are only examples and are not intended to limit the present invention. Among the components in the preferred embodiments described below, the components that are not described in the independent claim, which indicates the highest concept of the present invention, are described as optional components.

The drawings are schematic views and are not necessarily illustrated strictly. In the drawings, the same reference numerals are given to the substantially same components and a duplicated description of such components is omitted or simplified herein.

First Preferred Embodiment

A first preferred embodiment of the present invention will now be described with reference to FIG. 1 to FIG. 6.

Figure 2:
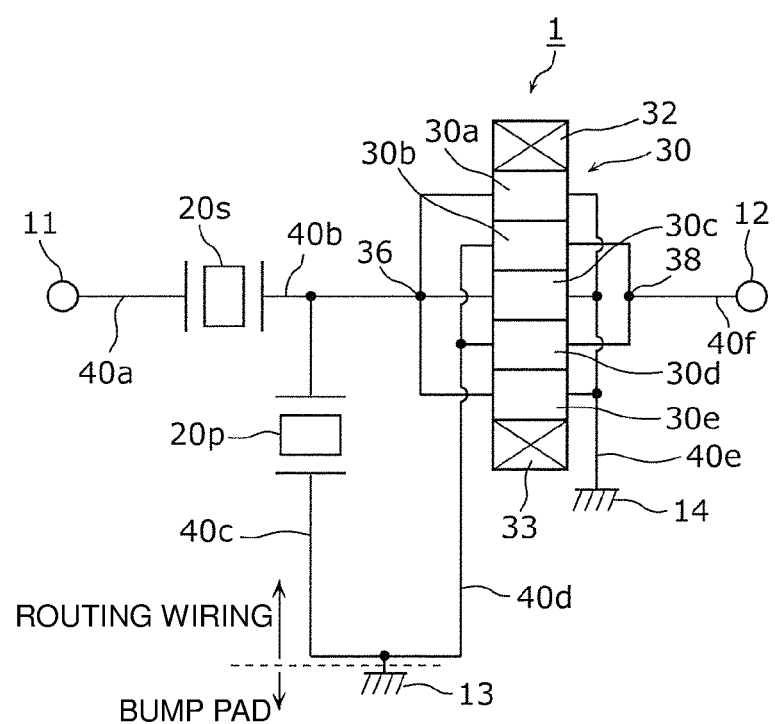
FIG. 2 is a circuit diagram illustrating the configuration of the surface acoustic wave filter according to the first preferred embodiment of the present invention.
Figure 3:
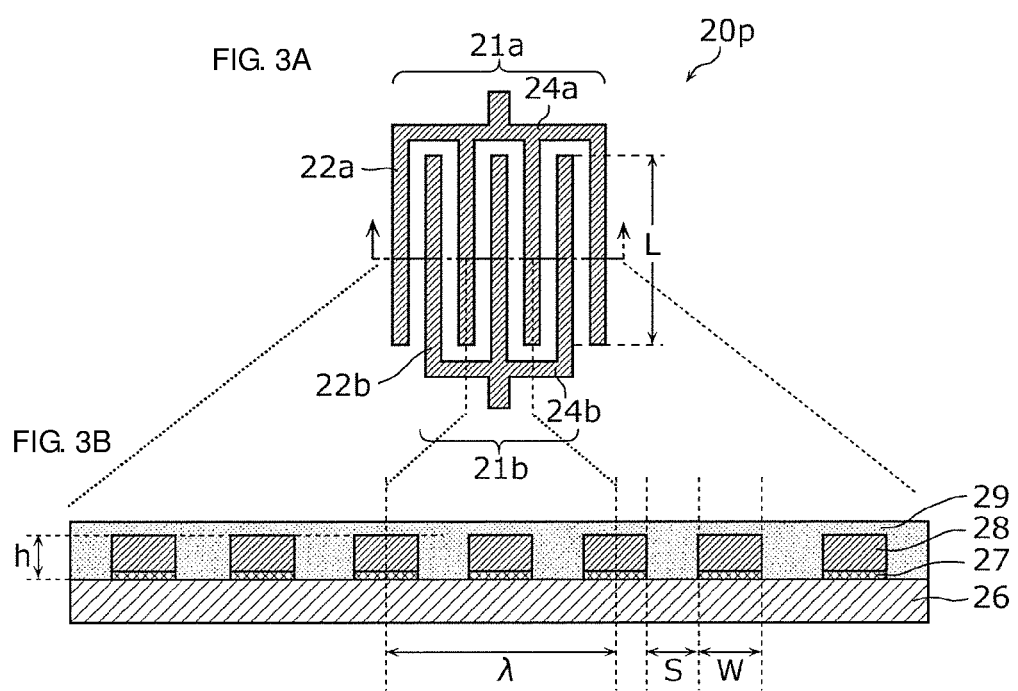
FIG. 3A is a schematic plan view illustrating an exemplary configuration of a parallel arm resonator in the surface acoustic wave filter according to the first preferred embodiment of the present invention and FIG. 3B is a schematic cross-sectional view, taken along an alternate long and short dash line illustrated in FIG. 3A.

An exemplary configuration of a surface acoustic wave filter 1 according to the first preferred embodiment will be described first. FIG. 1 is a plan view illustrating the configuration of the surface acoustic wave filter 1 according to the first preferred embodiment of the present invention. FIG. 2 is a circuit diagram illustrating the configuration of the surface acoustic wave filter 1 according to the first preferred embodiment of the present invention.

The surface acoustic wave filter 1 is preferably a reception filter having a pass band of, for example, a Band12 reception band (about 729 MHz to about 746 MHz) and a Band13 reception band (about 746 MHz to about 756 MHz).

As illustrated in FIG. 1 and FIG. 2, the surface acoustic wave filter 1 preferably includes an input terminal 11, an output terminal 12, ground terminals 13 and 14, a series arm resonator 20s, a parallel arm resonator 20p, a longitudinally coupled filter 30, and lines 40a to 40f on a substrate 10.

The substrate 10 is preferably, for example, a piezoelectric substrate made of $LiNbO_3$ single crystal having a certain cut angle. Surface acoustic waves are propagated in a certain direction in the substrate 10.

The input terminal 11, the output terminal 12, and the ground terminals 13 and 14 are preferably bump pads provided on the substrate 10.

The input terminal 11 is used to input a high-frequency signal from the outside of the surface acoustic wave filter 1 into the surface acoustic wave filter 1. The output terminal 12 is used to transmit a high-frequency signal transmitted through the surface acoustic wave filter 1 to the outside of the surface acoustic wave filter 1. The input terminal 11 may be replaced with the output terminal 12. Specifically, the input terminal 11 may be used as a terminal which receives an output and the output terminal 12 may be used as a terminal which receives an input.

The ground terminals 13 and 14 are used to connect the parallel arm resonator 20p and a portion of the electrodes of longitudinally coupled resonators 30a to 30e defining the longitudinally coupled filter 30 described in detail below to ground. The ground terminals 13 and 14 are connected to the ground outside the surface acoustic wave filter 1.

The input terminal 11, the output terminal 12, and the ground terminals 13 and 14 are preferably connected to the outside of the surface acoustic wave filter 1 through, for example, bonding.

The ground terminal is preferably a terminal (e.g., a reference terminal) having certain reference potential considered as ground potential and includes an external connection terminal connected to the outside of the surface acoustic wave filter 1 and an area resulting from expansion from the fringe of the external connection terminal by a certain range. The certain range is preferably, for example, an area corresponding to about 3% or less of the line width of the lines 40c, 40d, and 40e connected to the ground terminals 13 and 14 at nodes between the lines 40c, 40d, and 40e and the ground terminals 13 and 14. For example, solder, bumps, and so on spread across the external connection terminal and an area resulting from outward expansion from the fringe of the external connection terminal by an amount corresponding to about 3% of the line width of the lines 40c, 40d, and 40e are considered as the ground terminals.

The series arm resonator 20s and the longitudinally coupled filter 30 are connected in series between the input terminal 11 and the output terminal 12 in this order. In other words, the series arm resonator 20s is connected in series between the input terminal 11 and the longitudinally coupled filter 30.

The parallel arm resonator 20p is connected between a node between the input terminal 11 and the longitudinally coupled filter 30 and the ground (reference terminal). More specifically, the parallel arm resonator 20p is connected between the ground and the node between the series arm resonator 20s, which is connected in series between the input terminal 11 and the longitudinally coupled filter 30, and the longitudinally coupled filter 30. Accordingly, the series arm resonator 20s and the parallel arm resonator 20p compose a ladder filter. The series arm resonator 20s has a same structural configuration as that of the parallel arm resonator 20p. A detailed configuration of the series arm resonator 20s and the parallel arm resonator 20p will be described in detail below.

The longitudinally coupled filter 30 preferably includes the longitudinally coupled resonators 30a to 30e, reflectors 32 and 33, an input port 36, and an output port 38. The reflectors and 33 are preferably located on both sides of the longitudinally coupled filter 30 with the longitudinally coupled resonators 30a to 30e disposed therebetween.

The input sides of the longitudinally coupled resonators 30a, 30c, and 30e are provided together at the input port 36. The input port 36 is connected in series to the series arm resonator 20s. The output sides of the longitudinally coupled resonators 30a, 30c, and 30e are provided together and are connected to the ground terminal 14 via the line 40e described below.

The input sides of the longitudinally coupled resonators 30b and 30d are tied together to be connected to the ground terminal 13 via the line 40d. The output sides of the longitudinally coupled resonators 30b and 30d are tied together at the output port 38. The output port 38 is connected to the output terminal 12.

The configuration of the longitudinally coupled filter 30 and the longitudinally coupled resonators 30a to 30e will be described in detail below.

The lines 40a to 40f connect between the series arm resonator 20s, the parallel arm resonator 20p, the longitudinally coupled filter 30, the input terminal 11, the output terminal 12, and the ground terminals 13 and 14, which are provided on the substrate 10, so as to define the circuit illustrated in FIG. 2. The lines 40a to 40f are patterned on the substrate 10.

The line 40a connects the input terminal 11 to the series arm resonator 20s. The line 40b connects the series arm resonator 20s to the longitudinally coupled filter 30. The parallel arm resonator 20p is connected between the line 40b and the ground terminal 13. The line 40c connects the parallel arm resonator 20p to the ground terminal 13. The line 40d connects the longitudinally coupled resonators 30b and 30d to the ground terminal 13. The line 40e connects the longitudinally coupled resonators 30a, 30c, and 30e to the ground terminal 14. The line 40f connects the longitudinally coupled filter 30 to the output terminal 12. The lines 40d, 40e, and 40c are a first line, a second line, and a third line, respectively.

In the surface acoustic wave filter 1, the lines 40c and 40d are ground lines connected to the ground terminal 13. The lines 40c and 40d are independently connected to the ground terminal 13 and are not shared in the portion other than the ground terminal 13. In other words, the lines 40c and 40d define a routing wiring independently provided on the substrate 10 and are connected to the same ground terminal 13.

The lines 40a to 40f, the input terminal 11, the output terminal 12, and the ground terminals 13 and 14 may be concurrently patterned on the substrate 10 or may be separately provided thereon.

An exemplary configuration of the resonator will be described, taking the parallel arm resonator 20p as an example. Since the series arm resonator 20s preferably has the same configuration as that of the parallel arm resonator 20p, a detailed description of the configuration of the series arm resonator 20s is omitted herein.

FIGS. 3A and 3B are schematic views illustrating an exemplary configuration of the parallel arm resonator 20p in the surface acoustic wave filter 1 according to the first preferred embodiment. FIG. 3A is a plan view and FIG. 3B is a cross-sectional view, taken along an alternate long and short dash line illustrated in FIG. 3A.

As illustrated in FIGS. 3A and 3B, the parallel arm resonator 20p preferably includes a piezoelectric substrate 26 and interdigital transducer (IDT) electrodes 21a and 21b each having a comb shape.

The piezoelectric substrate 26 corresponds to the substrate 10 described above. For example, the piezoelectric substrate 26 is made of $LiNbO_3$ single crystal having a certain cut angle. Surface acoustic waves are propagated in a certain direction in the piezoelectric substrate 26.

As illustrated in FIG. 3A, a pair of the IDT electrodes 21a and 21b, which are opposed to each other, is provided on the piezoelectric substrate 26. The IDT electrode 21a preferably includes multiple electrode fingers 22a, which are parallel or substantially parallel to each other, and a busbar electrode 24a with which the multiple electrode fingers 22a are connected to each other. The IDT electrode 21b preferably includes multiple electrode fingers 22b, which are parallel or substantially parallel to each other, and a busbar electrode 24b with which the multiple electrode fingers 22b are connected to each other. The IDT electrode 21a and the IDT electrode 21b have a configuration in which the multiple electrode fingers 22b in the IDT electrode 21b are alternately arranged between the multiple electrode fingers 22a in the IDT electrode 21a.

The IDT electrode 21a and the IDT electrode 21b preferably include a structure in which an adhesive layer 27 and a main electrode layer 28 are laminated in a manner illustrated in FIG. 3B.

The adhesive layer 27 is provided to improve the adhesion between the piezoelectric substrate 26 and the main electrode layer 28 and is made of, for example, NiCr. The film thickness of the adhesive layer 27 is preferably, for example, about 10 nm. The material and the film thickness of the adhesive layer 27 are not limited to the above ones and may be appropriately changed.

The main electrode layer 28 is preferably made of, for example, Pt. The main electrode layer 28 has a film thickness of one kind and the film thickness of the main electrode layer 28 is, for example, about 83 nm. This simplifies the manufacturing process to realize low cost. The material and the film thickness of the main electrode layer 28 are not limited to the above ones and may be appropriately changed.

A protective layer 29 covers the IDT electrodes 21a and 21b. The protective layer 29 is provided in order to, for example, protect the main electrode layer 28 from the external environment, adjust frequency temperature characteristics, and improve moisture resistance. The protective layer 29 is preferably a film including, for example, silicon dioxide as a major component. The protective layer 29 may have any desirable film thickness.

The materials defining the adhesive layer 27, the main electrode layer 28, and the protective layer 29 are not limited to the ones described above. In addition, the IDT electrodes 21a and 21b may not have the above laminated structure. The IDT electrodes 21a and 21b may be made of, for example, metal or alloy, such as Ti, Al, Cu, Pt, Au, Ag, or Pd, or may include multiple multilayer bodies made of the above metal or alloy. The protective layer 29 may not be provided.

Referring to FIGS. 3A and 3B, parameters λ, S, W, and L indicate a repetition pitch of the electrode fingers 22a and the electrode fingers 22b, an interval between the adjacent electrode fingers of the electrode fingers 22a and the electrode fingers 22b, the width of each of the electrode fingers 22a and the electrode fingers 22b, and an intersecting width of the IDT electrode 21a and the IDT electrode 21b, respectively.

The structure of the parallel arm resonator 20p in the surface acoustic wave filter 1 is not limited to the structure illustrated in FIGS. 3A and 3B. For example, the IDT electrodes 21a and 21b may not have the laminated structure of the metal films and may be defined by a single layer of the metal film.

Figure 4:
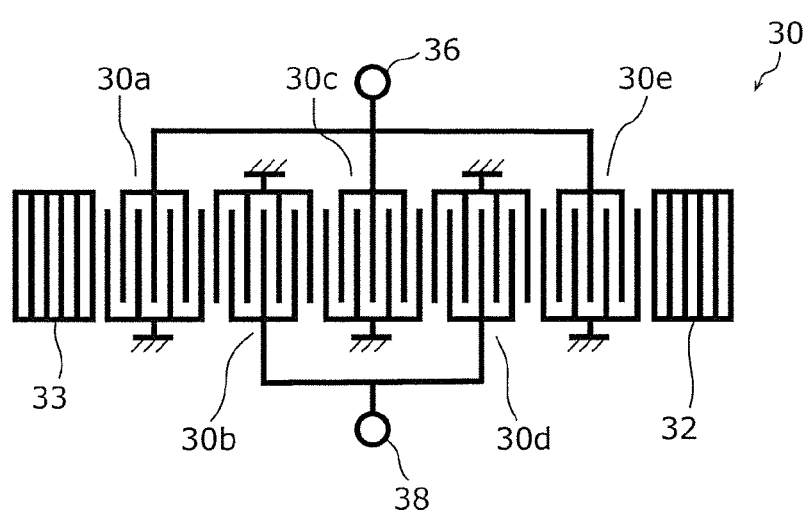
FIG. 4 is a schematic plan view illustrating an exemplary configuration of a longitudinally coupled filter in the surface acoustic wave filter according to the first preferred embodiment of the present invention.

FIG. 4 is a schematic plan view illustrating an exemplary configuration of the longitudinally coupled filter 30 in the surface acoustic wave filter 1 according to the first preferred embodiment.

Referring to FIG. 4, the longitudinally coupled filter 30 preferably includes the longitudinally coupled resonators 30a to 30e, the reflectors 32 and 33, the input port 36, and the output port 38.

The longitudinally coupled resonators 30a to 30e are each defined by a pair of IDT electrodes, which are opposed to each other. The longitudinally coupled resonators 30b and 30d are arranged so as to sandwich the longitudinally coupled resonator 30c therebetween and the longitudinally coupled resonators 30a and 30e are arranged so as to sandwich the longitudinally coupled resonators 30b to 30d therebetween. The longitudinally coupled resonators 30a, 30c, and 30e are connected in parallel between the input port 36, which is provided at the input terminal 11 side of the surface acoustic wave filter 1, and the reference terminal (ground). The longitudinally coupled resonators 30b and 30d are connected in parallel between the output port 38, which is provided at the output terminal 12 side of the surface acoustic wave filter 1, and the reference terminal.

The configuration of each of the longitudinally coupled resonators 30a to 30e is preferably the same as that of the parallel arm resonator 20p described above, a detailed description of the configuration of each of the longitudinally coupled resonators 30a to 30e is omitted herein. The IDT electrodes 21a and 21b in each of the longitudinally coupled resonators 30a to 30e and the IDT electrodes 21a and 21b of at least one of the series arm resonator 20s and the parallel arm resonator 20p may have a film thickness of one kind.

COMPARATIVE EXAMPLE

Figure 5:
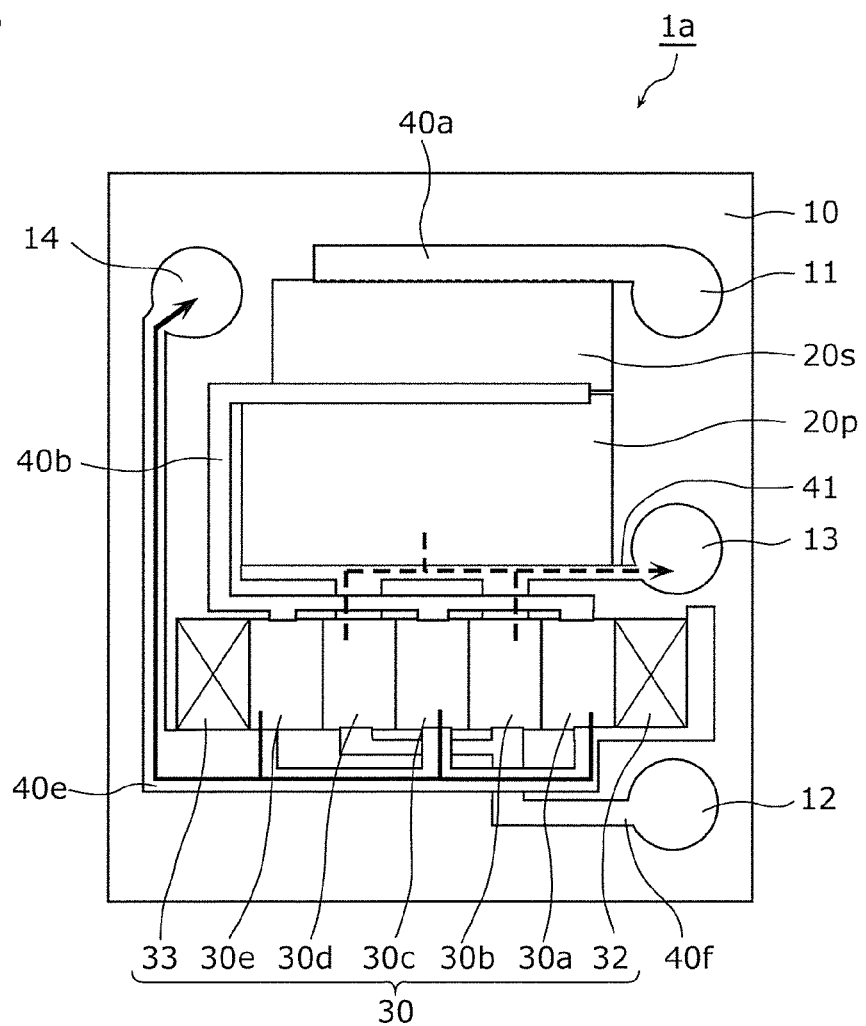
FIG. 5 is a plan view illustrating an exemplary configuration of a surface acoustic wave filter according to a comparative example.
Figure 6:
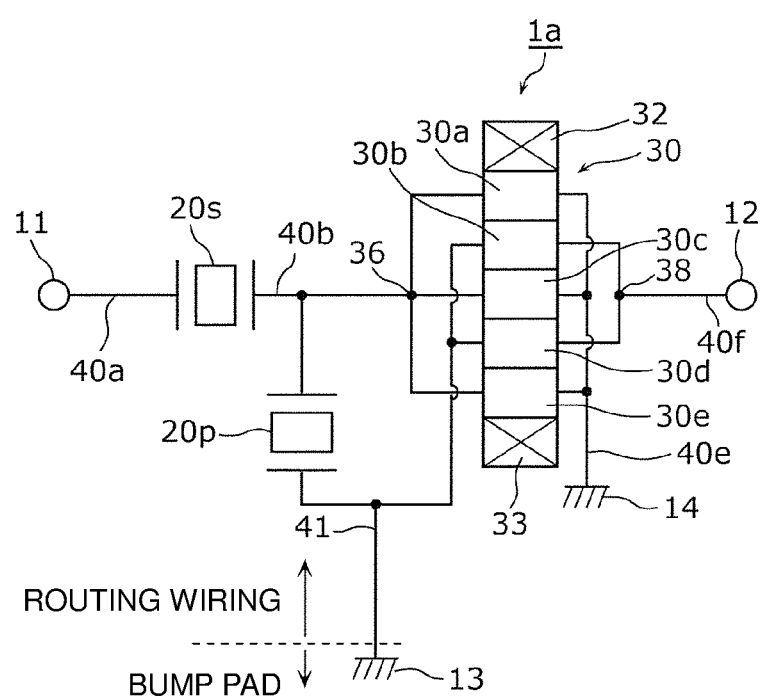
FIG. 6 is a circuit diagram illustrating the configuration of the surface acoustic wave filter according to the comparative example.

In order to improve understanding of the surface acoustic wave filter 1 according to the first preferred embodiment, a comparative example will be described. FIG. 5 is a plan view illustrating an exemplary configuration of a surface acoustic wave filter 1a according to the comparative example. FIG. 6 is a circuit diagram illustrating the configuration of the surface acoustic wave filter 1a according to the comparative example.

The surface acoustic wave filter 1a according to the comparative example includes the input terminal 11, the output terminal 12, the ground terminals 13 and 14, the series arm resonator 20s, the parallel arm resonator 20p, and the longitudinally coupled filter 30 on the substrate 10, as in the surface acoustic wave filter 1 according to the first preferred embodiment. However, the surface acoustic wave filter 1a according to the comparative example differs from the surface acoustic wave filter 1 according to the first preferred embodiment in the configuration of the line used to connect the parallel arm resonator 20p to the ground terminal 13 and the line used to connect the longitudinally coupled resonators 30b and 30d to the ground terminal 13.

As illustrated in FIG. 5, in the surface acoustic wave filter 1a, the parallel arm resonator 20p and the longitudinally coupled resonators 30b and 30d are connected to the ground terminal 13 via a line 41. In other words, the line 41 is a shared line commonly used to connect the parallel arm resonator 20p to the ground terminal 13 and to connect the longitudinally coupled resonators 30b and 30d to the ground terminal 13. Accordingly, as illustrated by a broken-line arrow in FIG. 5, signals are transmitted from the parallel arm resonator 20p to the ground terminal 13 and from the longitudinally coupled resonators 30b and 30d to the ground terminal 13 via the shared line 41. Specifically, in the surface acoustic wave filter 1a, the length of the line 41, which is routing wiring, is longer than the lengths of the lines in the surface acoustic wave filter 1 according to the first preferred embodiment, as illustrated in FIG. 5.

In contrast, in the surface acoustic wave filter 1 according to the first preferred embodiment, the line 40c used to connect the parallel arm resonator 20p to the ground terminal 13 and the line 40d used to connect the longitudinally coupled resonators 30b and 30d to the ground terminal 13 are independently routed without being shared and are independently connected to the ground terminal 13, as illustrated in FIG. 1.

With the above configuration, in the surface acoustic wave filter 1, a parasitic inductance component is able to be reduced, compared with the surface acoustic wave filter 1a. The parasitic inductance component results from the sharing of the line (the ground line) used to connect the parallel arm resonator 20p to the ground terminal 13 and the line (the ground line) used to connect the longitudinally coupled resonators 30b and 30d to the ground terminal 13. As a result, the attenuation of the surface acoustic wave filter 1 is able to be made sharp and the amount of attenuation is able to be increased at the low frequency side of the band of the surface acoustic wave filter 1. Accordingly, it is possible to realize the surface acoustic wave filter 1 having excellent transmission characteristics.

As described above, with the surface acoustic wave filter 1 according to the first preferred embodiment, the parasitic inductance component resulting from the sharing of the line used to connect the parallel arm resonator 20p to the ground terminal and the line used to connect the longitudinally coupled resonators 30b and 30d to the ground terminal 13 is able to be reduced. As a result, the attenuation of the surface acoustic wave filter 1 is able to be made sharp and the amount of attenuation is able to be increased at the low frequency side of the band of the surface acoustic wave filter 1. Accordingly, it is possible to realize the surface acoustic wave filter 1 having excellent transmission characteristics.

Although the configuration is described in the above first preferred embodiment in which the surface acoustic wave filter 1 includes the series arm resonator 20s, the parallel arm resonator 20p, and the longitudinally coupled filter 30, it is sufficient for the surface acoustic wave filter 1 to include at least the parallel arm resonator 20p and the longitudinally coupled filter 30. The surface acoustic wave filter 1 may have a configuration that does not include the series arm resonator 20s depending on a desired pass band. Even in such a case, the attenuation of the surface acoustic wave filter 1 is able to be made sharp and the amount of attenuation is able to be increased at the low frequency side of the band of the surface acoustic wave filter 1. In addition, it is possible to further improve the bandpass characteristics of the surface acoustic wave filter 1 by, for example, adjusting the impedance of the pass band to ensure the attenuation at the high frequency side outside the band.

Although the configuration is adopted in the above first preferred embodiment in which the input sides of the longitudinally coupled resonators 30b and 30d in the longitudinally coupled filter 30 are connected to the ground terminal 13, a configuration may be adopted in which the output sides of the longitudinally coupled resonators 30a, 30c, and 30e are connected to the ground terminal 13 or a configuration may be adopted in which both the input sides of the longitudinally coupled resonators 30b and 30d and the output sides of the longitudinally coupled resonators 30a, 30c, and 30e are connected to the ground terminal 13.

Second Preferred Embodiment

A surface acoustic wave filter 2 according to a second preferred embodiment of the present invention will now be described.

The surface acoustic wave filter 2 according to the second preferred embodiment of the present invention differs from the surface acoustic wave filter 1 according to the first preferred embodiment of the present invention in that all the lines connected to the ground potential are connected to the ground terminal 13 in the longitudinally coupled filter 30.

Figure 7:
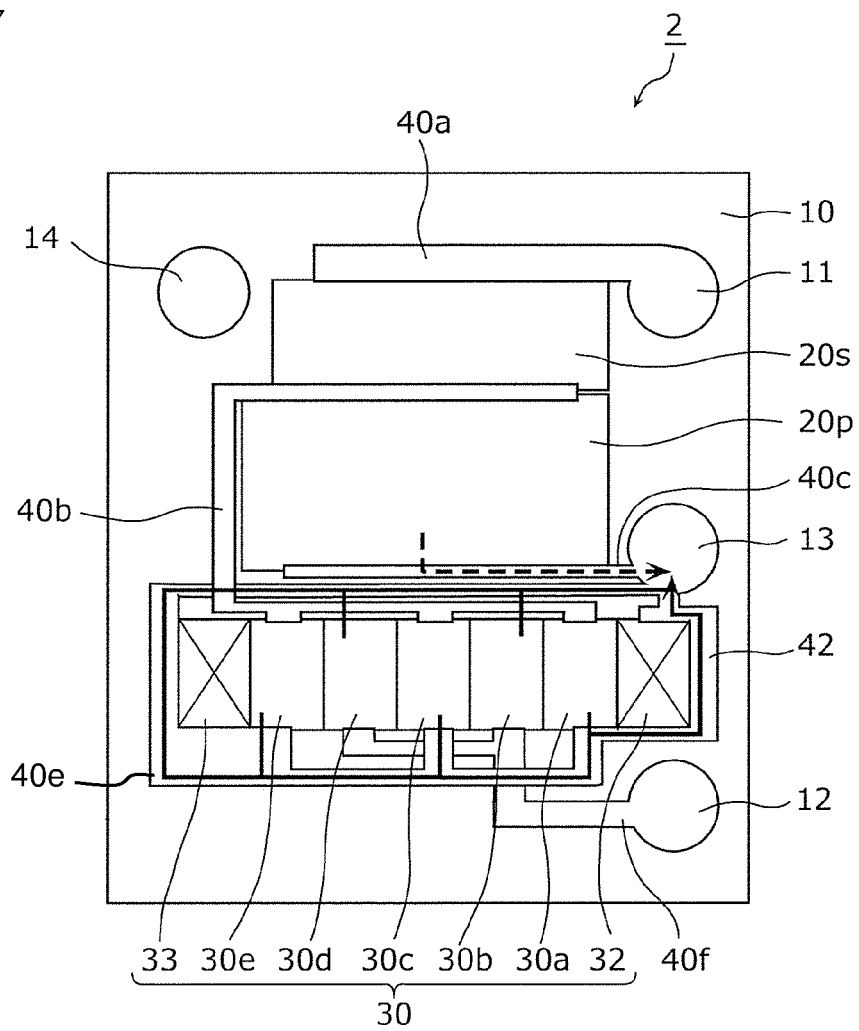
FIG. 7 is a plan view illustrating an exemplary configuration of a surface acoustic wave filter according to a second preferred embodiment of the present invention.
Figure 8:
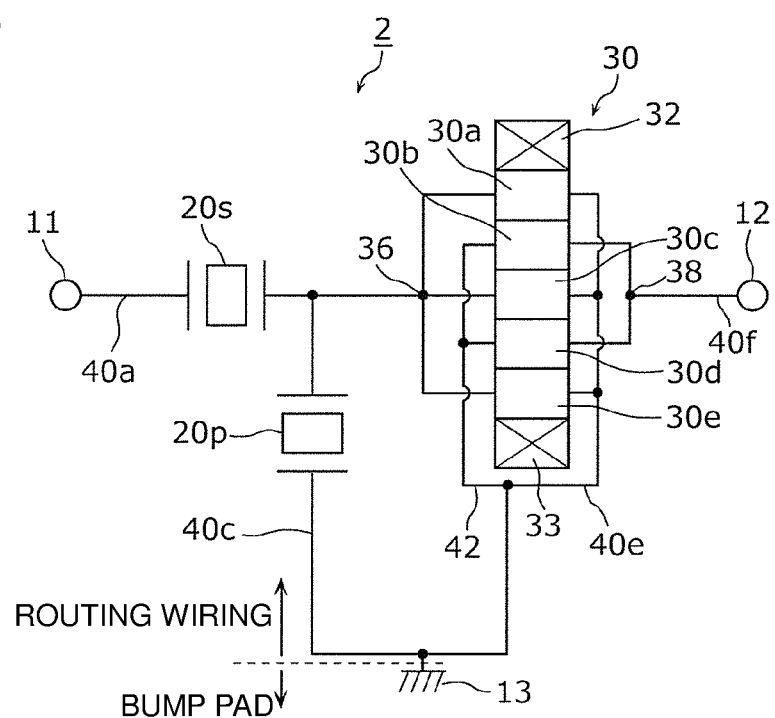
FIG. 8 is a circuit diagram illustrating the configuration of the surface acoustic wave filter according to the second preferred embodiment of the present invention.

FIG. 7 is a plan view illustrating an exemplary configuration of the surface acoustic wave filter 2 according to the second preferred embodiment. FIG. 8 is a circuit diagram illustrating the configuration of the surface acoustic wave filter 2 according to the second preferred embodiment.

As illustrated in FIG. 7, the surface acoustic wave filter 2 preferably includes the input terminal 11, the output terminal 12, the ground terminals 13 and 14, the series arm resonator 20s, the parallel arm resonator 20p, and the longitudinally coupled filter 30 on the substrate 10, as in the surface acoustic wave filter 1 according to the first preferred embodiment. Since the configuration of the input terminal 11, the output terminal 12, the ground terminals 13 and 14, the series arm resonator 20s, the parallel arm resonator 20p, and the longitudinally coupled filter 30 is the same as that of the input terminal 11, the output terminal 12, the ground terminals 13 and 14, the series arm resonator 20s, the parallel arm resonator 20p, and the longitudinally coupled filter 30 in the surface acoustic wave filter 1 according to the first preferred embodiment, a detailed description of the configuration is omitted herein.

The surface acoustic wave filter 2 includes the lines 40a, 40b, 40c, 40e, 40f and a line 42. The lines 40a, 40b, 40c, 40e and 40f are the same as the lines 40a, 40b, 40c, 40e and 40f illustrated in the first preferred embodiment.

The line 42 connects the input sides of the longitudinally coupled resonators 30b and 30d to the ground terminal 13, as illustrated in FIG. 7 and FIG. 8. The line 40e connects the output sides of the longitudinally coupled resonators 30a, 30c, and 30e to the ground terminal 13, as described above. The line 40e and the line 42 are shared immediately before the line 40e and the line 42 are connected to the ground terminal 13 and, then, are connected to the ground terminal 13, as illustrated in FIG. 7. In other words, the line 40e and the line 42 are tied together to be connected to the ground terminal 13, as illustrated in FIG. 8.

Accordingly, as illustrated by a solid-line arrow in FIG. 7, all of the longitudinally coupled resonators 30a to 30e in the longitudinally coupled filter 30 are connected to the ground terminal 13. The parallel arm resonator 20p is connected to the ground terminal 13 via the independent line 40c, which is different from the lines 40e and 42 used to connect the longitudinally coupled resonators 30a to 30e to the ground terminal 13, as illustrated in FIG. 7. In other words, the line 40c and the lines 40e and 42 are independently routed to be connected to the ground terminal 13.

With the above configuration, since it is not necessary to use the ground terminal 14, which is used in the surface acoustic wave filter 1 according to the first preferred embodiment, the ground terminal 14 is able to be omitted. Accordingly, it is possible to decrease the number of the ground terminals to reduce the size of the surface acoustic wave filter 2.

Figure 9:
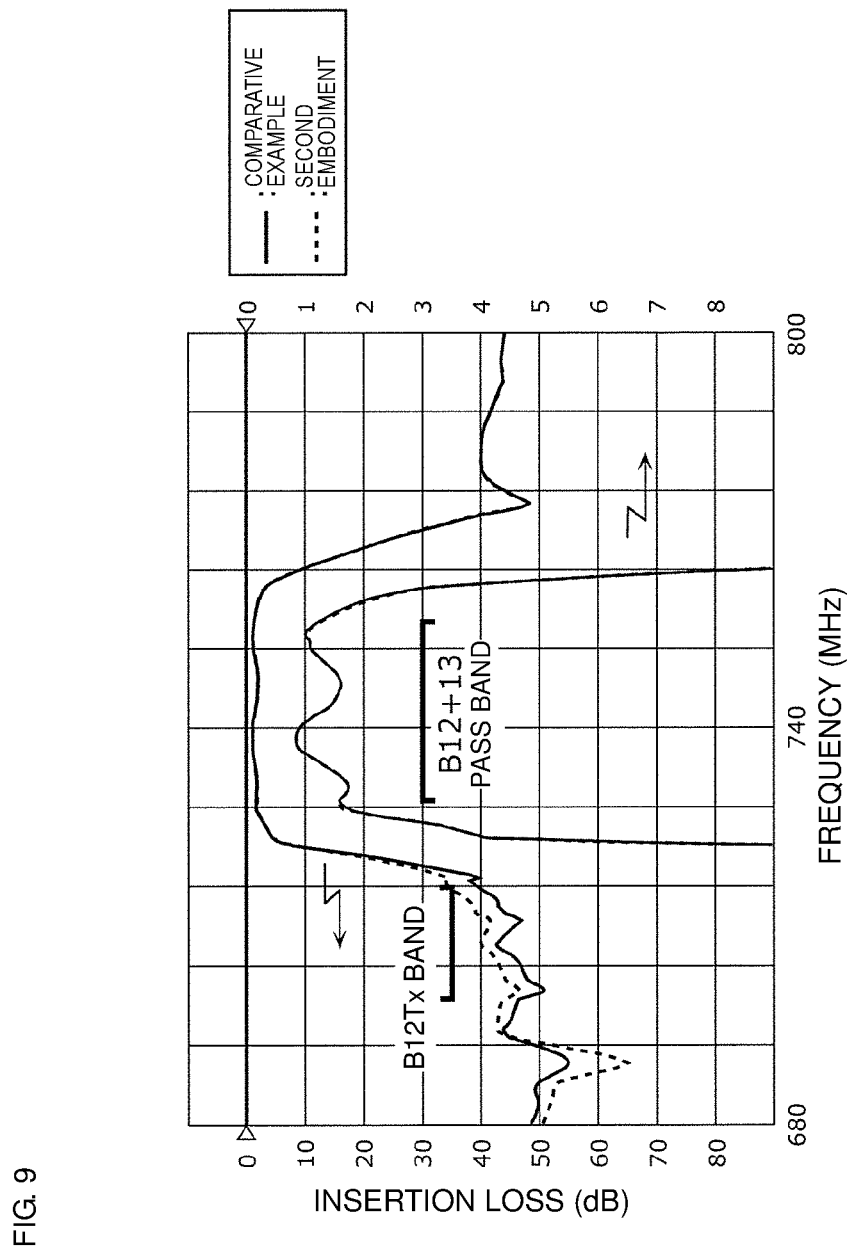
FIG. 9 is a graph illustrating transmission characteristic of the surface acoustic wave filter according to the second preferred embodiment of the present invention.

The transmission characteristics of the surface acoustic wave filter 2 will now be described. FIG. 9 is a graph illustrating the transmission characteristic of the surface acoustic wave filter 2 according to the second preferred embodiment. The transmission characteristic of the surface acoustic wave filter 1a according to the comparative example of the first preferred embodiment is also illustrated for comparison in FIG. 9.

As illustrated by a solid line in FIG. 9, in the surface acoustic wave filter 1a according to the comparative example, the amount of attenuation is decreased and the attenuation is made gentle in an attenuation band at the low frequency side of the pass band.

In contrast, as illustrated by a broken line in FIG. 9, in the surface acoustic wave filter 2 according to the second preferred embodiment, the amount of attenuation is larger than that in the surface acoustic wave filter 1a and the attenuation is made sharp in the attenuation band at the low frequency side of the pass band. In other words, with the surface acoustic wave filter 2, it is possible to make the attenuation sharp and to increase the amount of attenuation at the low frequency side of the band of the surface acoustic wave filter 2.

As described above, with the surface acoustic wave filter 2 according to the second preferred embodiment, since the line 40c connects the parallel arm resonator 20p to the ground terminal 13 and the line 42 connects the longitudinally coupled resonators 30a to 30e in the longitudinally coupled filter 30 to the ground terminal 13 are independently routed without being shared, the parasitic inductance component resulting from the sharing of the line 40c and the line 42 is able to be reduced. As a result, it is possible to make the attenuation sharp and to increase the amount of attenuation at the low frequency side of the band of the surface acoustic wave filter 2.

In addition, the sharing of the ground terminal 13 connected to the parallel arm resonator 20p and the ground terminal 13 connected to the longitudinally coupled resonators 30a to 30e in the longitudinally coupled filter 30 enables the number of the ground terminals to be decreased. Accordingly, it is possible to reduce the surface acoustic wave filter in size while keeping excellent transmission characteristics of the surface acoustic wave filter.

Also in the second preferred embodiment, it is sufficient for the surface acoustic wave filter 2 to include at least the parallel arm resonator 20p and the longitudinally coupled filter 30. The surface acoustic wave filter 2 may have a configuration that does not include the series arm resonator 20s depending on a desired pass band. Even in such a case, it is possible to make the attenuation of the surface acoustic wave filter 2 sharp and to increase the amount of attenuation at the low frequency side of the band of the surface acoustic wave filter 2.

Other Preferred Embodiments

The present invention is not limited to the configurations described in the above preferred embodiments and changes and variations may be appropriately made, as in modifications described below.

For example, although the surface acoustic wave filter 1 is preferably a reception filter using the Band12 reception band and the Band13 reception band as the pass band in the above first preferred embodiment, the surface acoustic wave filter 1 is not limited to this. The surface acoustic wave filter 1 may be a reception filter using another band as the reception band. The surface acoustic wave filter 1 is not limited to the reception filter and may be a transmission filter or a transmission-reception filter capable of both transmission and reception.

Although the surface acoustic wave filter 1 according to the first preferred embodiment described above preferably has the configuration in which the input sides of the longitudinally coupled resonators 30b and 30d in the longitudinally coupled filter 30 are connected to the ground terminal 13, the surface acoustic wave filter 1 may have a configuration in which the output sides of the longitudinally coupled resonators 30a, 30c, and 30e are connected to the ground terminal 13 or a configuration in which both the input sides of the longitudinally coupled resonators 30b and 30d and the output sides of the longitudinally coupled resonators 30a, 30c, and 30e are connected to the ground terminal 13, as in the surface acoustic wave filter 2 according to the second preferred embodiment.

Although the longitudinally coupled filter 30 preferably has a configuration including five longitudinally coupled resonators 30a to 30e in the above preferred embodiments, the configuration of the longitudinally coupled filter 30 is not limited to this. The number of the longitudinally coupled resonators in the longitudinally coupled filter 30 may be varied as desired.

Although the surface acoustic wave filter 1 preferably has the configuration in which one pair of the series arm resonator 20s and the parallel arm resonator 20p is connected to the longitudinally coupled filter 30 in the above first preferred embodiment, the configuration of the surface acoustic wave filter 1 is not limited to this. It is sufficient for the surface acoustic wave filter 1 to have a configuration in which at least one parallel arm resonator 20p is connected to the longitudinally coupled filter 30. In other words, the number of the series arm resonators 20s and the parallel arm resonators 20p may be appropriately varied. For example, a configuration may be adopted in which three series arm resonators and two parallel arm resonators are provided and the parallel arm resonators are connected to the respective nodes of the series arm resonators.

Preferred embodiments achieved by making various modifications to the above-described preferred embodiments or realized by appropriately combining the components and the functions in the above preferred embodiments within the spirit and scope of the present invention are also included in the present invention.

Preferred embodiments of the present invention are applicable to, for example, a communication device, such as a transmission apparatus or a reception apparatus, including the surface acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
   a longitudinally coupled filter that is connected between an input terminal and an output terminal on a main surface of a piezoelectric substrate and that includes at least one longitudinally coupled resonator; and
   a parallel arm resonator connected between a node between the input terminal and the longitudinally coupled filter and ground; wherein
   a third line connecting the parallel arm resonator to the ground and at least one of a first line connecting an interdigital transducer electrode at an input side of the longitudinally coupled filter to the ground and a second line connecting an interdigital transducer electrode at an output side of the longitudinally coupled filter to the ground are independently provided and are independently connected to a same terminal provided on the piezoelectric substrate.

2. The surface acoustic wave filter according to claim 1, wherein the first line and the third line are independently provided, the second line and the third line are independently provided, and the first line, the second line, and the third line are connected to the same terminal.

3. The surface acoustic wave filter according to claim 1, further comprising:
   a series arm resonator connected in series between the input terminal and the longitudinally coupled filter; wherein
   the parallel arm resonator is connected between a node between the series arm resonator and the longitudinally coupled filter and the ground.

4. The surface acoustic wave filter according to claim 3, wherein each of the series arm resonator and the parallel arm resonator includes interdigital transducer electrodes that are opposed to each other and that each have a comb shape.

5. The surface acoustic wave filter according to claim 3, wherein the longitudinally coupled filter includes longitudinally coupled resonators, reflectors, an input port, and an output port.

6. The surface acoustic wave filter according to claim 5, wherein the longitudinally coupled resonators are provided in a middle of the longitudinally coupled filter with ones of the reflectors provided on opposed ends of the longitudinally coupled filter.

7. The surface acoustic wave filter according to claim 5, wherein
   input sides of a first group of the longitudinally coupled resonators are provided together and connected at the input port;
   output sides of the first group of the longitudinally coupled resonators are provided together and are connected to the ground;
   input sides of a second group of the longitudinally coupled resonators are provided together and connected to the ground;
   output sides of the second group of the longitudinally coupled resonators are provided together and connected to the output port; and
   the input port is connected in series to the series arm resonator.

8. The surface acoustic wave filter according to claim 5, wherein
   input sides of a first group of the longitudinally coupled resonators are provided together and connected at the input port;
   output sides of the first group of the longitudinally coupled resonators are provided together and are connected to the ground;
   input sides of a second group of the longitudinally coupled resonators are provided together and connected to both the ground and the output sides of the first group;
   output sides of the second group of the longitudinally coupled resonators are provided together and connected to the output port; and
   the input port is connected in series to the series arm resonator.

9. The surface acoustic wave filter according to claim 5, wherein each of the longitudinally coupled resonators and the parallel arm resonator includes interdigital transducer electrodes that are opposed to each other and that each have a comb shape.

10. The surface acoustic wave filter according to claim 1, wherein the parallel arm resonator includes a piezoelectric substrate and interdigital transducer electrodes each having a comb shape.

11. The surface acoustic wave filter according to claim 10, wherein the interdigital transducer electrodes each include multiple electrode fingers which are parallel or substantially parallel to each other and a bulbar electrode which connects the multiple electrode fingers to each other.

12. The surface acoustic wave filter according to claim 10, wherein the interdigital transducer electrodes each include a layered structure in which an adhesive layer and a main electrode layer are laminated.

13. The surface acoustic wave filter according to claim 12, wherein
the adhesive layer is made of NiCr and has a film thickness of about 10 nm; and
the main electrode layer is made of Pt and has a film thickness of about 83 nm.

14. The surface acoustic wave filter according to claim 10, further comprising:
a protective layer which covers the interdigital transducer electrodes; wherein
the protective layer is a film containing silicon dioxide as a main component.

15. The surface acoustic wave filter according to claim 10, wherein the interdigital transducer electrodes are made of Ti, Al, Cu, Pt, Au, Ag, or Pd or an alloy including at least one of Ti, Al, Cu, Pt, Au, Ag, or Pd.

16. The surface acoustic wave filter according to claim 10, wherein the piezoelectric substrate is made of $LiNbO_3$ single crystal.

17. The surface acoustic wave filter according to claim 1, further comprising ground terminals defining the ground.

18. The surface acoustic wave filter according to claim 17, wherein the input terminal, the output terminal, and the ground terminals are bump pads provided on the piezoelectric substrate.

19. The surface acoustic wave filter according to claim 1, wherein the surface acoustic wave filter is a reception filter.

20. The surface acoustic wave filter according to claim 19, wherein a pass band of the reception filter is about 729 MHz to about 746 MHz or about 746 MHz to about 756 MHz.

* * * * *